(12) United States Patent
Adusumilli et al.

(10) Patent No.: US 10,580,893 B2
(45) Date of Patent: Mar. 3, 2020

(54) SEALED CAVITY STRUCTURES WITH NON-PLANAR SURFACE FEATURES TO INDUCE STRESS

(71) Applicant: GLOBALFOUNDRIES INC., Grand Cayman (KY)

(72) Inventors: Siva P. Adusumilli, Burlington, VT (US); Steven M. Shank, Jericho, VT (US); Anthony K. Stamper, Burlington, VT (US); John J. Ellis-Monaghan, Grand Isle, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/947,364

(22) Filed: Apr. 6, 2018

(65) Prior Publication Data

US 2019/0312142 A1  Oct. 10, 2019

(51) Int. Cl.
| | |
|---|---|
| *H01L 29/78* | (2006.01) |
| *H01L 21/762* | (2006.01) |
| *H01L 21/84* | (2006.01) |
| *H01L 21/324* | (2006.01) |
| *H01L 23/10* | (2006.01) |
| *H01L 29/06* | (2006.01) |
| *H01L 29/10* | (2006.01) |
| *H01L 27/12* | (2006.01) |
| *H01L 21/02* | (2006.01) |
| *H01L 21/8238* | (2006.01) |

(52) U.S. Cl.
CPC .... *H01L 29/7842* (2013.01); *H01L 21/02293* (2013.01); *H01L 21/324* (2013.01); *H01L 21/7624* (2013.01); *H01L 21/823807* (2013.01); *H01L 21/84* (2013.01); *H01L 23/10* (2013.01); *H01L 27/1203* (2013.01); *H01L 29/0649* (2013.01); *H01L 29/1029* (2013.01)

(58) Field of Classification Search
CPC ................................................... H01L 29/7842
USPC ......................................................... 257/288
See application file for complete search history.

(56) References Cited

U.S. PATENT DOCUMENTS

| | | | |
|---|---|---|---|
| 9,064,930 B2 * | 6/2015 | Langdo | H01L 21/28518 |
| 9,165,945 B1 * | 10/2015 | Sadaka | H01L 27/1211 |
| 2015/0249033 A1 * | 9/2015 | Le Vaillant | H01L 21/2007 |
| | | | 257/618 |

OTHER PUBLICATIONS

Reiche et al., "Strained Silicon-On-Insulater—Fabrication and Characterization", ECS Transactions, The Electrochemical Society, 2007, 6 pages.
Suthram et al., "Study of the piezoresistive properties of Si, Ge and GaAs MOSFETs using a novel flexure based wafer bending setup", University of Florida, May 2008, 108 pages.

(Continued)

*Primary Examiner* — Jami Valentine Miller
(74) *Attorney, Agent, or Firm* — David Cain; Andrew M. Calderon; Roberts Mlotkowski Safran Cole & Calderon, P.C.

(57) ABSTRACT

The present disclosure relates to semiconductor structures and, more particularly, to sealed cavity structures having a non-planar surface features and methods of manufacture. The structure includes a cavity formed in a substrate material. The cavity is covered with epitaxial material that has a non-planar surface topography which imparts a stress component on a transistor.

19 Claims, 11 Drawing Sheets

(56) References Cited

OTHER PUBLICATIONS

Parthasarathy, "Strain Effects in Long to Short Channel MOSFETs: From Drift-Diffusion to Quasi-Ballistic Transport", University of Florida, 2012, 185 pages.
Specification and Drawings for related U.S. Appl. No. 15/790,707, filed Oct. 23, 2017, 28 pages.
Specification and Drawings for related U.S. Appl. No. 15/645,655, filed Jul. 10, 2017, 27 pages.
Specification and Drawings for related U.S. Appl. No. 15/876,727, filed Jan. 22, 2018, 34 pages.

* cited by examiner

SEALED CAVITY STRUCTURES WITH NON-PLANAR SURFACE FEATURES TO INDUCE STRESS

FIELD OF THE INVENTION

The present disclosure relates to semiconductor structures and, more particularly, to sealed cavity structures having non-planar surface features and methods of manufacture.

BACKGROUND

Radio frequency (RF) devices are used in many different types of communication applications. For example, RF devices can be used in cellular telephones with wireless communication components such as switches, MOSFETs, transistors and diodes.

As cellular telephones become more complex and commoditized, there is an increasing need to provide higher performance and lower price points for the wireless communication components. A significant fraction of the cost of manufacturing an RF switch, for example, is the cost to engineer very high linearity such that harmonic distortion is extremely low and meets product specifications.

RF devices are typically manufactured on high resistivity silicon wafers or substrates to achieve the needed RF linearity. State-of-the-art trap rich silicon on insulator (SOI) high resistivity substrates offer excellent vertical isolation and linearity, but the SOI wafer can be up to 50% of the total manufacturing cost because they can be 5 to 10 times the cost of high resistivity non-SOI substrates, i.e., a RF device formed on a SOI wafer could have a total normalized manufacturing cost of 1.0 while a similar device formed on a high resistivity non-SOI bulk wafer could have a total normalized manufacturing cost of 0.6. Devices built on bulk Si substrates have been known to suffer from degraded linearity, harmonics, noise, and leakage currents, any of which will degrade device performance thus necessitating the higher cost of SOI wafers.

SUMMARY

In an aspect of the disclosure, a structure comprises a cavity formed in a substrate material, the cavity being covered with epitaxial material that has a non-planar surface topography which imparts a stress component on a transistor.

In an aspect of the disclosure, a structure comprises: a substrate material; a cavity formed in the substrate which includes a trench having a curved edge portion at its upper end; a first material within the trench which migrates to the upper end of the trench and which includes a non-planar surface topography; and a second material which covers the first material, the non-planar surface topography of the first material imparting a stress component into the second material In an aspect of the disclosure, a method comprises: forming a trench in a substrate material; filling a top portion of the trench with a first epitaxial material; and covering the first epitaxial material with a second epitaxial material at a certain temperature such that the first epitaxial material reflows and forms a non-planar topography at least over the trench and imparts a stress component on the second epitaxial material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to sealed cavity structures having non-planar surface features and methods of manufacture. In more specific embodiments, the present disclosure provides a structure with a localized embedded airgap (i.e., cavity) with stress tailored SiGe—Si topography for a FET(s) on a bulk Si or SOI substrate. In embodiments, the cavity structures can be formed from cavities or trenches (bars), sealed with an epitaxial material after an annealing process. Advantageously, the implementation of the present disclosure enables a well-controlled sealing of the trenches (with or without cavities) while also providing a tailored stress component at the top of the trenches for subsequent fabrication of semiconductor devices.

In embodiments, cavity structures can be formed in bulk silicon wafers (or SOI) with either standard resistivity of 0.1 to 100 ohm-cm or high resistivity silicon wafers, e.g., a resistivity >>1 ohm-cm or about 1 Kohm-cm to about 10 Kohm-cm or higher. In embodiments, the cavity structures are formed under source/drain regions extending to a bottom of a PN junction, under gate structures or with the source/drain PN junction bottom above and not touching the cavity. In further embodiments, the cavity structures can be formed with a dual well stack with deep trench isolation structures to avoid depletion region punch through, or in a triple well structure without deep trench isolation structures, amongst other implementations described herein.

In any of the disclosed implementations, the cavity structures can be used with radio frequency (RF) FETs or NPNs, such as FET switches, with the cavity structures under such devices or under source/drain regions or combinations thereof on a single wafer. In any of the disclosed implementations, trenches (bars) or holes leading to the cavity structures are subjected to an optional annealing process prior to being sealed with an epitaxial material. This annealing process will soften the edges. For example, the annealing process will form a curvature at the entrance of the trench or hole, which enables subsequent deposition processes to seal the cavity through a reflow process. The sealing material can be a combination of epitaxial SiGe and Si, for example, which under certain temperature or deposition conditions will result in a non-planar surface topography (e.g., concave surface or convex surface).

In embodiments, the non-planar surface topography of the SiGe and/or Si epitaxial material will effectively create a stress component (e.g., compressive/tensile stress component) to increase device performance of, e.g., RF devices including switches, LNA's, and logic. It is further contemplated that the stress component can be either a vertical stress component or a lateral stress component. The lateral stress component can be particularly beneficial for providing a compressive stress component on a PFET device to increase its performance.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1A:
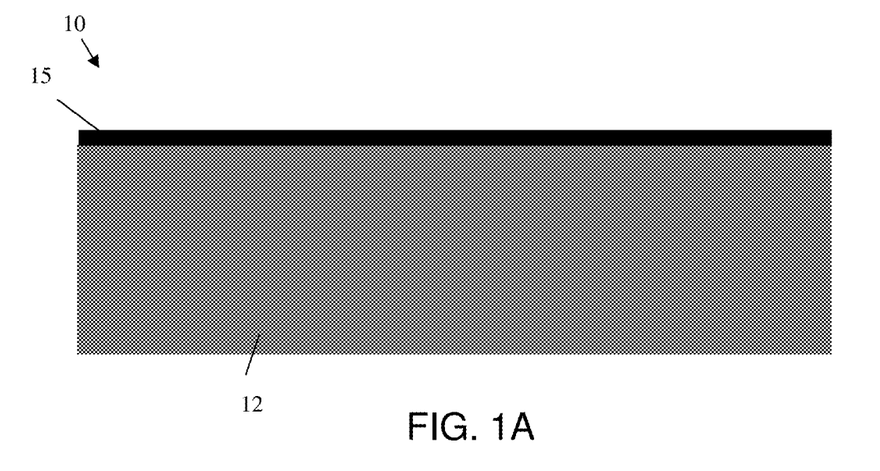
FIGS. 1A-1H show structures and respective fabrication processes in accordance with aspects of the present disclosure.

FIG. 1A shows an incoming structure in accordance with aspects of the present disclosure. In particular, the structure 10 includes a substrate 12. The substrate 12 can comprise an insulator, such as silica glass, quartz, alumina, etc., or a semiconductor of any resistivity known in the art. In embodiments, suitable semiconductor material can be, e.g., Si (e.g., crystalline Si), SiGe, SiGeC, SiC, GaAs, InAs, InP, and other III/V or II/VI compound. The substrate 12 can be of high resistivity silicon with resistivity in the range of about between 1 Kohm-cm to 10 kΩ.cm, as an illustrative example. It should be recognized that resistivities of 1K kΩ.cm and greater are sufficient to significantly reduce substrate induced harmonic distortion and losses. Higher resistivities, though, are also contemplated to 20 Kohm-cm or greater.

Still referring to FIG. 1A, one or more pad films 15 such as, e.g., oxide and nitride, are deposited on the substrate 12. Alternatively, any combination of conductors, semiconductors, or insulators can be used to form the pad films 15. In embodiments, the nitride or oxide can be deposited by a conventional deposition process, e.g., chemical vapor deposition (CVD). If the substrate is formed from silicon than the oxide can be formed in furnace oxidizations of the silicon. In embodiments, the nitride can be deposited to a thickness of about 100 nm to 200 nm; whereas, the oxide can be deposited to a thickness of about to 10 nm; although other dimensions are also contemplated herein.

Figure 1B:
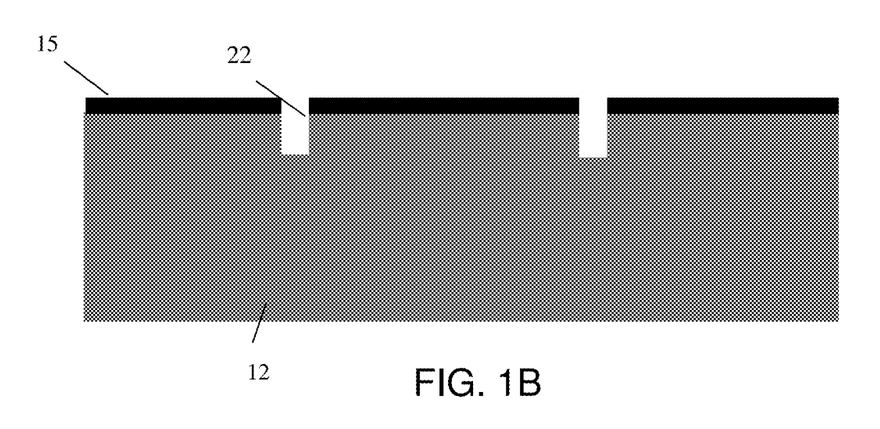

Referring to FIG. 1B, openings or trenches 22 are patterned on the pad dielectric films 15, followed by an etching and trench formation into the substrate 12. The trenches 22 can include "holes" and/or "bars", e.g., a single trench extending a defined length along and under the source drain regions and/or gates of the devices. In embodiments, holes would have 1:1 aspect ratio as seen from above; whereas bars (trenches) would have aspect ratios >1:1 as seen from above.

In embodiments, the trenches 22 can be formed by conventional lithography and etching processes. For example, a resist formed over the pad dielectric films 15 is exposed to energy (light) to form a pattern (opening). An etching process with a selective chemistry, e.g., reactive ion etching (RIE), will be used to form one or more trenches 22 through the openings of the resist, through the pad films 15, and into the substrate 12. The resist can then be removed by a conventional oxygen ashing process or other known stripants. The width of the trenches 22 is determined by the lithography resolution. In one illustrative example, the pad films are 100 nm thick, the trenches are 120 nm wide, holes and the trenches are 0.8 micron deep into the substrate 12.

Figure 1C:
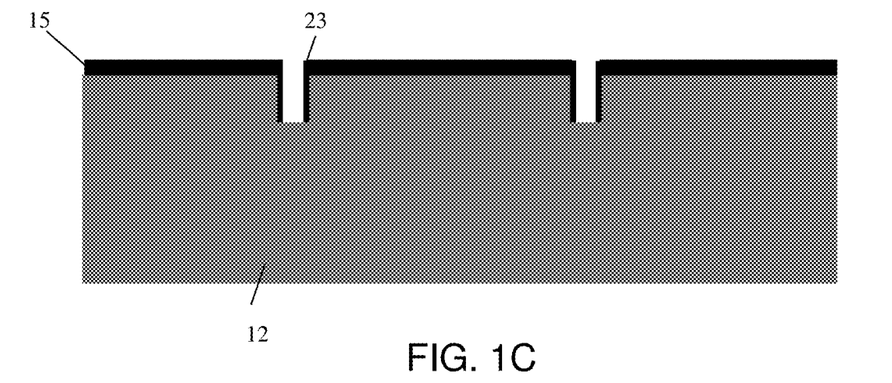

Referring to FIG. 1C, a sidewall liner (also referred to as a spacer) 23 is formed on the sidewalls of the trenches 22 by depositing a dielectric material and anisotropically etching the dielectric material from the bottom and top planar features of the structure. In embodiments, the sidewall liner 23 can be an oxide material, as an example. In embodiments, the oxide could be composed of a combination of a thermal oxidization of the silicon substrate 12 in a furnace followed by a CVD, ALD, or any other known oxide deposition method. In embodiments, the anisotropic etch could consist of a reactive ion etch (RIE) using a perfluorocarbon-based chemistry, as is known in the art, which etches material from planar surfaces but leaves the dielectric material on the sidewall of the trenches 22.

In embodiments, the sidewall liner 23 is one or more of any suitable dielectric material such as one or more oxide or nitride layers or combination of dielectric layers deposited using any known deposition method, e.g., CVD, thermal oxidization of the silicon substrate, or atomic layer deposition (ALD) or any of these combinations. The sidewall liner 23 should robustly coat the sidewalls of the trenches 22 in order to protect the underlying substrate material 12 from subsequent etching processes (for cavity formation). In another embodiment, the sidewall of trenches 22 are thermally oxidized to form a $SiO_2$ layer which extends under the dielectric films 15. Following this thermal oxidization, the sidewall liner 23 can undergo an anisotropic etch. In embodiments, the top surface of pad film 15 is exposed to the spacer etch and is thinned but not fully removed.

To achieve a robust sidewall coverage, the dielectric material or materials needs to be thick enough to leave a thick film on the sidewalls of the trenches 22 but not too thick that it pinches off the top opening of the trenches 22, which would prevent cavity formation during the successive cavity etch. For example, 40 nm of nitride can be deposited on a 100 nm wide trench.

Figure 1D:
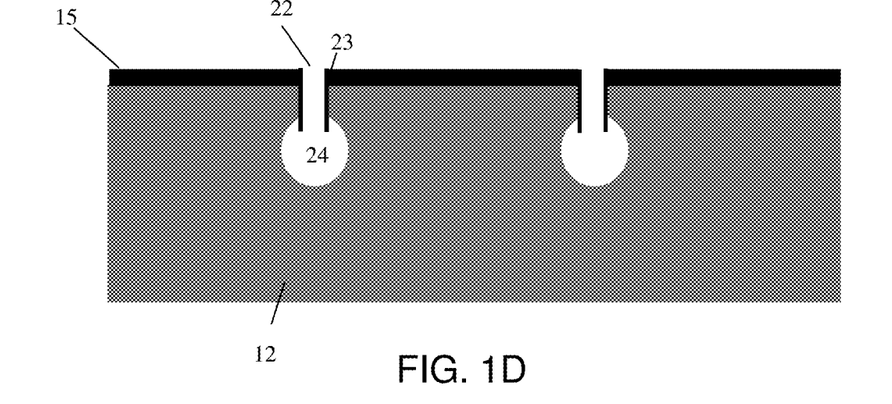

As shown in FIG. 1D, cavity structures 24 are selectively formed in the substrate 12 by a substrate etching process through the bottom of the trenches 22. The pad films 15 on the substrate surface and the spacer films (e.g., sidewall liner) 23 on the side of the trenches 22 will protect the substrate 12 from being unintentionally etched. In embodiments, an optional vapor or liquid HF treatment, hydrogen plasma, anneal, basic or acidic chemical clean, or any process known to remove thin or native dielectrics or residual spacer etch polymer from the substrate 12 (e.g., silicon) can be used to remove any excessive dielectric at a bottom of the trenches 22 prior to etching the cavity 24. The post sidewall liner etch cleans (e.g., anisotropic etch) should leave a robust dielectric liner 23 on the top corner and sidewall of the trenches 22 to prevent etching of the substrate 12 through the sidewall of the trenches 22 during the cavity formation. If a thermal oxide formed in a furnace for sidewall liner 23 is used, then silicon under the pad films 15 is oxidized, which may provide a better protective barrier to prevent unintentional substrate 12 etching during the formation of the cavity structure 24.

Following the formation of the sidewall liner 23 and optional clean(s), exposed substrate material at the bottom of the trench 22 can be removed to form the cavity structure 24. To avoid unintentional etching of the substrate 12 on the sidewall of the trenches 22 and top surface of the structure, the pad dielectric material 15 and sidewall liner 23 will completely cover the substrate 12 at the areas to be protected from the etching. In embodiments, the exposed substrate material 12 can be removed by a wet etching process or dry etching process. For example, dry etchants can include plasma-based $CF_4$, plasma-based $SF_6$, or gas $XeF_4$ silicon etch, etc., and wet etching processes can include KOH and $NH_4OH$. Depending on the time of etching, the cavity structures can merge together.

In embodiments, the cavity structures 24 can be formed under what will be the FET source/drain regions extending to a bottom of a PN junction under and between gate structures; under the FET gates; or both. In further embodiments, the cavity structures 24 can merge together to form a single cavity under the FET gates and/or source/drain regions. Illustratively, the cavity structure 24 can be under the source/drain regions of a FET or under the gate of the FET, depending on the particular application. Alternatively, the cavity structures 24 can be formed under any passive device, such as a silicon diffusion or polysilicon resistor, or active device, such as a FET, SiGe HBT, bipolar junction transistor, MESFET, etc.

Figure 7:
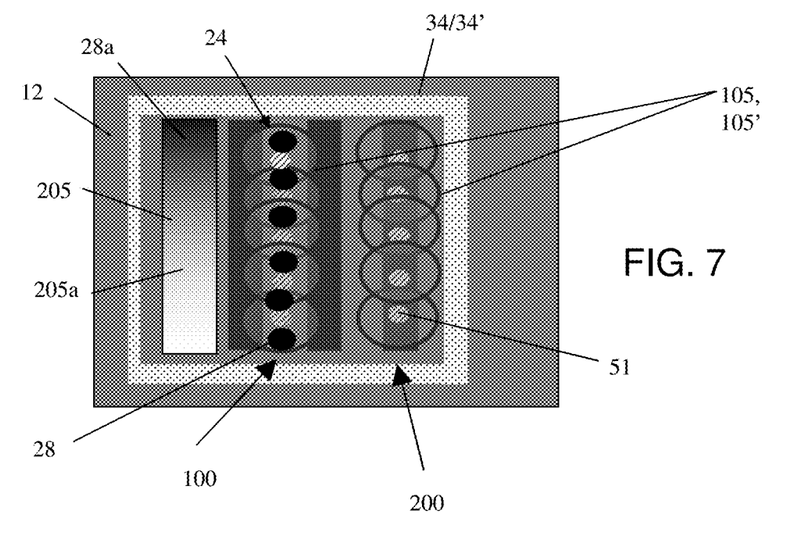
FIG. 7 shows a top view of an embodiment with cavity structures under both the FET source/drain and gate of the device in accordance with aspects of the present disclosure.

The cavity structure 24 located under the channel prevents source/drain punch-through, reduces junction capacitance, and modifies the stress on the channel. In addition, the cavity structure 24 located under the source drain region reduces junction capacitance and modifies the stress on the channel. In embodiments, where the cavity structures 24 substantially merge or not merge under the channel parallel to the channel (where a preferred embodiment is merging the cavity structures together as shown in FIG. 7).

In embodiments, the upper surface of cavity structure 24 can be about 300 nm in depth below the top surface of the substrate 12; although other dimensions are also contemplated herein. In addition, the cavity structure 24 can have a diameter of about 200 nm to about 800 nm as an example; although other dimensions are contemplated herein.

Figure 1E:
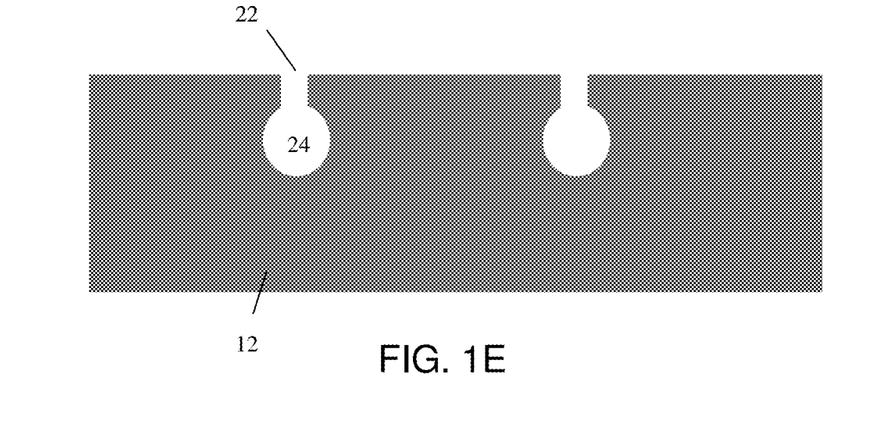

In FIG. 1E, the sidewall liner 23 and pad dielectric films 15 are removed from the structure, exposing the upper surface of the substrate 12 and the sidewalls of the trenches 22. In embodiments, the sidewall liner and pad dielectric films can be removed by a conventional etching process selective to such materials. For example, the sidewall liner and pad dielectric films can be removed by using only or a combination of hot phosphorous followed by an HF chemistry or vice-versa depending on the single dielectric layer or stack of different dielectric layers used for sidewall liner.

Figure 1F:
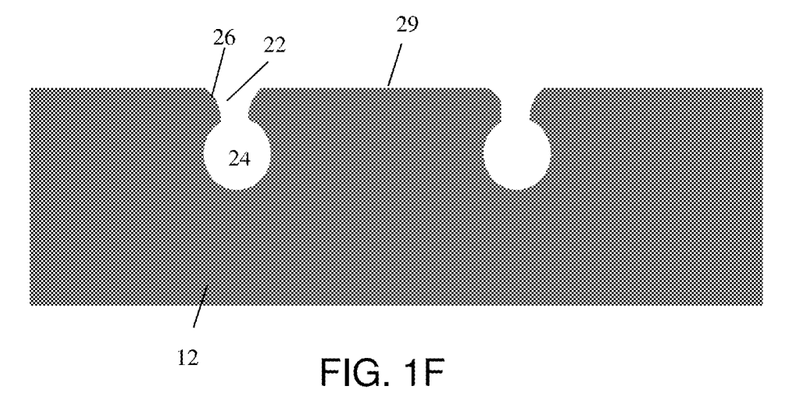

Following the removal of the sidewall liner and pad dielectric films, the trenches 22 are subjected to an optional annealing process to soften or round (curve) the edges of the trenches, as shown representatively at reference numeral 26 in FIG. 1F. By way of one example, following an HF preclean process, the structure can undergo an annealing process at a temperature range of about 600° C. to about 1100° C., for up to about 60 seconds. In more specific embodiments, the annealing process can be at a temperature of about 650° C. for 60 seconds. In embodiments, the annealing process can be performed in an $H_2$ atmosphere; although other hydrogen atmospheres are also contemplated herein, e.g., $NH_3$, $B_2H_6$, $Ph_3$, $AsH_2$ or other gases bonded to hydrogen. In embodiments, the annealing in an $H_2$ or other hydrogen atmosphere may remove any native or other oxide from the silicon substrate surface, while also smoothing or reflowing the walls of the cavity structure 24. If little or no curvature 26 is used, then the annealing temperature, time, or hydrogen-based gas flow is reduced to eliminate or minimize the substrate reflow process.

In embodiments, the critical dimension between the optionally curved silicon 26 at the top of the trenches 22 can be increased by approximately 30% or more during the anneal. In preferred embodiments, though, the annealing process should increase the critical dimension of the curved silicon 26 at the top of the trenches 22 to about 20%. For example, with a trench opening of 120 nm, the critical dimension of the silicon curvature post annealing can increase to about 156 nm, as one non-limiting illustrative example. In this way, the volume at the opening at the top of the trench will be increased, which will effectively allow for more material to be deposited and reflowed therein to completely seal the trench. It should be understood by those of skill in the art that the curvature 26 can be adjusted by temperature and gas flow. For example, the radius of curvature and the critical dimension between the curved silicon at the top of trenches 22 can be increased by increasing the temperature and with adding $H_2$ the required temperature for certain curvatures is reduced.

Figure 1G:
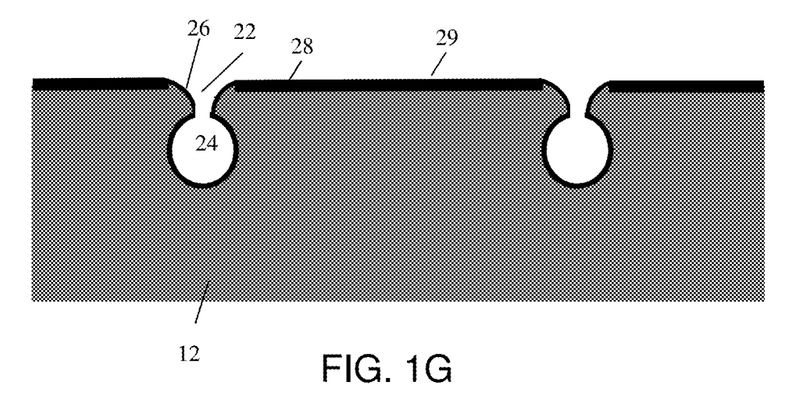

In FIG. 1G, a material 28 is deposited on the surface 29 of the substrate 12 including, e.g., the optional surface of the curvature 26, sidewalls of the trenches 22 and sidewalls of the cavity structure 24. In embodiments, the material 28 can be epitaxial SiGe deposited using ultra high vacuum CVD (UHVCVD); although other semiconductor materials, poly or epitaxial films and deposition processes are contemplated herein. By way of example, SiGe material 28 can be deposited at a temperature of about 600° C. to 850° C., resulting in a thickness of about 5 nm to about 50 nm and more preferably to a thickness of about 5 nm to about 10 nm. In embodiments, 15 nm of SiGe material 28 is deposited at 650° C. with the width of the trench 22 being about 120 nm. It should be understood that other thicknesses of the material 28 can be applied, depending on the critical dimension of the trenches 22. In general, as the width of the trench 22 increases, the thickness of material 28 to fill in the top of the trench 22 during the subsequent reflow anneal also increases.

In embodiments, the material 28 is SiGe with a Ge concentration of about 5% to about 30%, as an example. In further embodiments, the Ge concentration of the SiGe material is graded from 0% to a maximum percent and then graded back to 0%. In embodiments, the maximum percent of Ge can be about 30%. The SiGe material will deposit on the exposed surfaces; although the SiGe thickness in the sidewalls of the trench 22 could be thinner on planar surfaces 29 of the substrate 12 as compared to sidewalls 26 and cavities 24, as shown in FIG. 1G.

Figure 1H:
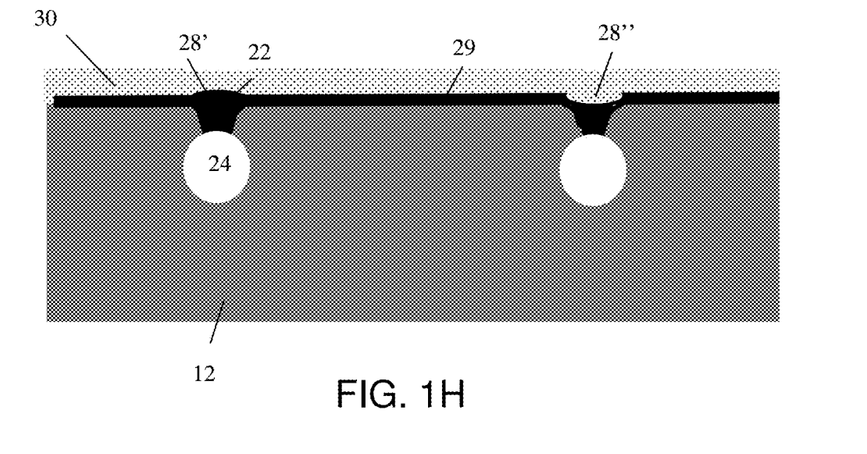

As shown in FIG. 1H, the material 28 is reflowed during the deposition of semiconductor material 30 by subjecting the wafer to a temperature equal to or greater than the reflow temperature of material 28. In this way, the material 28 fills in the top of trench 22. Since SiGe has a lower reflow temperature than silicon, SiGe material 28 can be reflowed into the opening of the trench 22 to plug or fill the top of the trench 22 without filling in the cavity 24. In embodiments, the reflow temperature is about 800-1050° C. and the reflow time is anywhere up to about 600 seconds; although other temperatures and time conditions are contemplated herein depending on the desired surface topography of the reflowed material 28. In embodiments, the reflow temperature is 850° C. and the reflow time is 60 seconds.

As shown FIG. 1H, the semiconductor material 30 is deposited over the trenches 22 (and the remaining surface of the structure), including over the reflowed material 28. In embodiments, the semiconductor material 30 can be another trench sealing layer, e.g., Si material, deposited using an epitaxial CVD process to either finish sealing the trenches 22 or depositing additional material over the surface 29 and trench top 22, thereby forming a cavity 24 (comprising the sealed trench and cavity). In embodiments, the semiconductor material 30 can be composed of a lower layer of SiGe and an upper layer of Si.

The semiconductor material 30 can be deposited to a thickness of about 150 nm in a deposition chamber having a temperature of about 850° C. to about 1050° C. for about 60 seconds. At this temperature, the material 28 will continue to reflow (although other temperatures and time are contemplated herein depending on the desired surface topography of the reflowed material 28), continuing to gravitate or migrate into the upper portion of the trenches 22 (e.g., typically at the smallest critical dimension). In more specific embodiments, the deposition of the semiconductor material 30 will result in a non-planar surface topography (e.g., bowed up (concave) surface topography 28' and/or bowed down (convex) surface topography 28") of the reflowed material 28, e.g., SiGe material. The surface topography will impart a stress on the semiconductor material 30 which can be used to increase performance of the PFET and NFET devices built on the semiconductor material 30. The semiconductor material 30 may also reflow during the bake, filling in the increased volume at the top of the trench. This reflow will also assist in sealing the trenches 22, thereby forming the cavity 24. In embodiments, the top of the trench 22 is fully sealed with SiGe material 28 prior to deposition of a Si material 30.

The non-planar surface topography (e.g., bowed up (concave) surface topography 28' and/or bowed down (convex) surface topography 28") of the reflowed SiGe material 28 is controlled by the deposition temperature of SiGe and/or Si, Ge content of the material 28 and thickness, as examples. The non-planar surface topography 28', 28" of the material 28 can also be controlled by reflow temperature, time, and hydrogen or hydrogen-based gas flow. For example, a higher temperature will result in a bowed up surface topography 28'; whereas, a lower temperature will result in a bowed down surface topography 28". More specifically, a reflow temperature in the range of about is 800-1050° C. will result in a bowed up surface topography 28' and a reflow temperature in the range of about is 650-850° C. will result in a bowed down surface topography 28".

It should also be noted that application of temperature during the reflow process will affect the size and shape of the cavity structure 24. In particular, the cavity structure 24 becomes a different shape, e.g., oval shape, slightly shrinking its volume compared to its original shape (see, e.g., FIG. 2D). If the cavity structure 24 is not sealed prior to silicon layer 28 deposition, then some of semiconductor layer 30 may deposit inside the cavity.

Figure 2A:
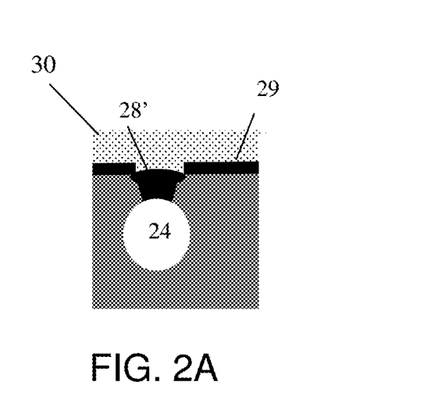
FIGS. 2A-2D show different non-planar surfaces, amongst other features, and respective fabrication processes in accordance with aspects of the present disclosure.
Figure 2B:
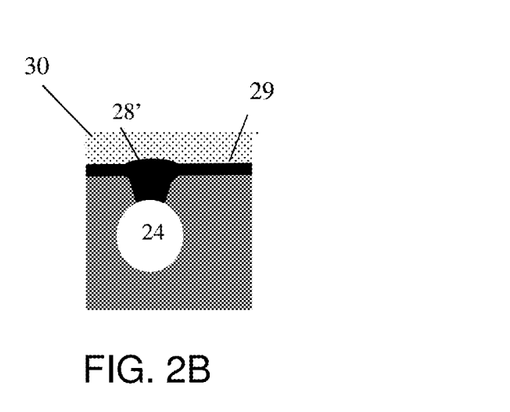

In embodiments, the non-planar surface topographies 28', 28" of the reflowed material 28 can be formed inside of the trench (or cavity structure 24) or outside of the trench (or cavity structure), e.g., above a surface 29, at different locations on the wafer as described with respect to FIGS. 3-6. For example, FIG. 2A shows the bowed up surface topography 28' within the trench, itself; whereas, FIG. 2B shows the bowed up surface topography 28' extending above the surface 29 of the wafer.

Figure 2C:
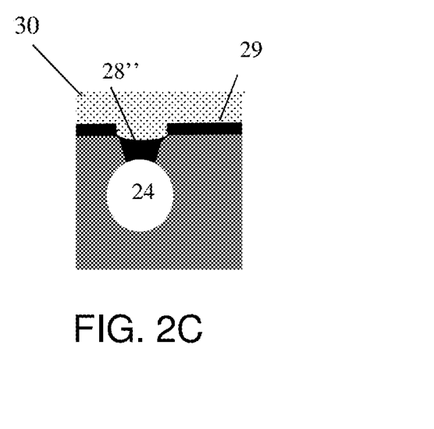
Figure 2D:
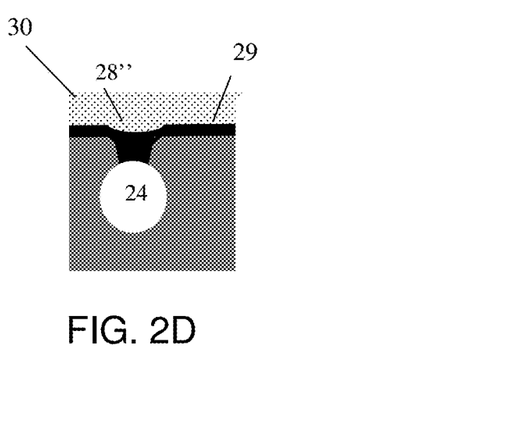

Similarly, FIG. 2C shows the bowed down surface topography 28" within the trench, itself; whereas, FIG. 2D shows the bowed down surface topography 28" at or extending above the surface 29 of the wafer. It should also be recognized that adjacent bowed down surface topographies 28" can result in a bowed up surface topography 28' between the adjacent bowed down surface topographies 28", as shown by way of example in FIG. 3. In addition, in any of the embodiments, the widths of the trenches 22 can modulate the magnitude of the bow, e.g., bowed down surface topographies 28" and bowed up surface topographies 28', and the area of the lattice mismatch. Accordingly, critical dimensions of the trenches 22 can be independently varied to optimized the compressive stress component for PFETs and tensile stress component for NFETs.

Figure 3:
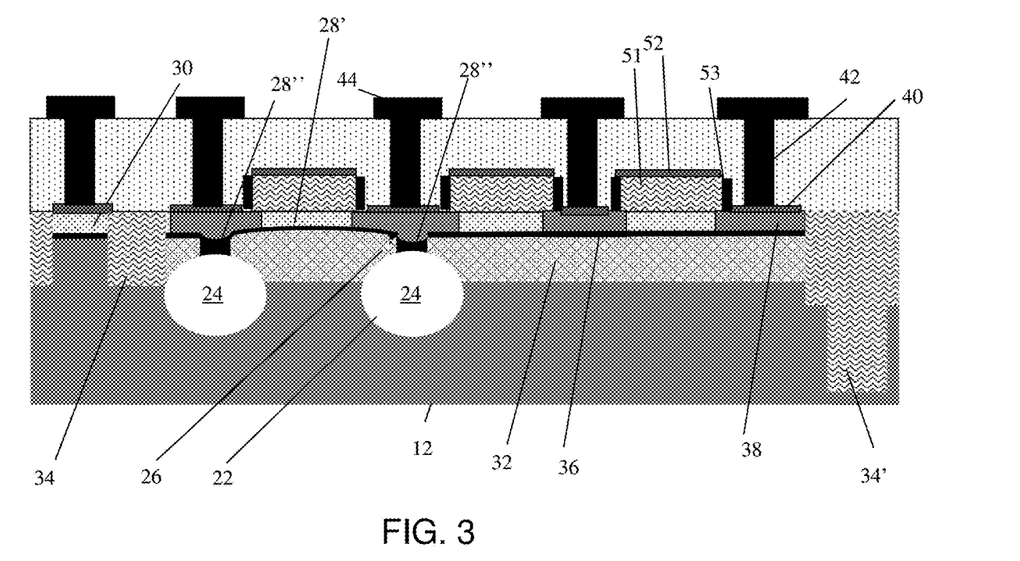
FIG. 3 shows a cross-sectional view of a FET with particular surface topographies, amongst other features, and respective fabrication processes in accordance with aspects of the present disclosure.

FIG. 3 shows a cross-sectional view of a FET with particular surface topographies, and respective fabrication processes in accordance with aspects of the present disclosure. In this representation, the epitaxial material 28 will have a bowed down surface topography 28" above the cavity structures 24, under the source/drain regions 38. This will result in a bowed up surface topography 28' under the FET gate 51. In this implementation, the FET gate 51 is a PFET. By having the bowed down surface topography 28" under the source/drain regions 28 and bowed up surface topography 28' created under the PFET gate 51, a compressive stress will be created in the channel region of the PFET gate 51 which increase performance of the PFET gate 51, e.g., by applying a compressive stress on the PFET in the channel to improve PFET hole mobility.

Still referring to FIG. 3, wire 44 and contact 42 are formed in dielectric 110 and are connected to FET source/drain region 38. The PFET gate 51 is between the source/drain regions 38. Silicide 52 and 40 are formed over PFET gate 51 and source/drain regions 38. Specifically cavity structure(s) 24 is formed under the source or drain regions of the PFET gates 51. (In additional embodiments, as described herein, cavity structures can be formed under both the source and drain of the FET; under the gate of the FET; or both).

As shown further in FIG. 3, the cavity structures 24 are formed in a well-implant region 32 of the substrate 12. In embodiments, the well is an n-well 32 for a PFET (or p-well for a NFET). In embodiments, the n-well 32 can be formed using conventional doping or ion implanting processes to, e.g., a depth of about 0.3 μm to about 3 μm. In embodiments, the cavity structure(s) 24 can touch the bottom of the source/drain junctions 38. In further embodiments, the bottoms of source/drain depletion region can touch the cavity structure(s) 24. It is also contemplated that any of the following can be intersected by the cavity structures: a depletion region under the source/drain regions; a triple well (see, e.g., reference numeral 300 of FIGS. 9A-9D) under the FET; and a junction of the source/drain region (see, e.g., reference numeral 200 of FIGS. 9A-9D).

Moreover, in embodiments, the depletion regions from the wells 32 in the substrate 12 are kept inside the region surrounded by deep trench isolation structures 34. In embodiments, the deep trench isolation structures 34 can be formed in the substrate 12 to completely isolate adjacent well region 32 and the RF devices 36 from DC substrate currents. In embodiments, the cavity structures 24 may be isolated from each other, connected to each other, or both.

Still referring to FIG. 3, as should also be understood by those of ordinary skill in the art, the transistors can be formed by conventional CMOS processes. The transistors can be formed by deposition of gate dielectrics (e.g., high-k dielectrics such as Hafnium oxide, etc.), followed by gate metals (e.g., different work function metals), patterning of the materials using lithography and etching (e.g., reactive ion etching (RIE) to form the gate stacks, followed by sidewall formation, e.g., oxide or nitride materials deposited on the gate stacks). Source regions and drain regions 38 are formed within the substrate 12 (well region 32) or on the substrate 12 over the well region 32 (e.g., for raised source/drain regions) using conventional dopant or ion implantation processes such that no further explanation is required. In embodiments, an epitaxial growth process can be used to form the raised source/drain regions. The cavity structures 24' can be formed in the source/drain regions extending to a bottom of a PN junction under the transistors 36, e.g., touching the source/drain regions 38.

The source/drain regions 38 may contain transistor p-type halo, n-type extension implants, and n-type source/drain implants as known in the art. The n-type source/drain region can intercept the cavity structures 24 such that the pn junction area between the n-type source/drain and p-type p-well of the transistor is reduced. This reduction in the source/drain junction area will reduce the junction capacitance. Since the junction capacitance is non-linear with voltage, this reduction will improve the transistor linearity.

Silicide contacts 40 are formed on the source/drain regions 38 and over the cavity structures 24. In embodiments, the silicide process begins with deposition of a thin transition metal layer, e.g., nickel, cobalt or titanium, over fully formed and patterned semiconductor devices (e.g., doped or ion implanted source/drain regions and respective devices 36). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts 40 in the active regions of the devices, e.g., devices. Subsequently formed contacts 42 will touch this silicided region 40 to make contact to the source/drain of the transistor 36. In embodiments, the cavity structures 24 are formed pre-silicide or, in some embodiments, between gate formation and silicide processes. Wiring layers and other back end of the line structures 44 are formed in contact with the contacts 42 using, again, conventional CMOS deposition and patterning processes.

The transistors 36 formed on the material 30 may include switches, e.g., multifinger PFET switches, etc. (or NFET switches as described with respect to FIG. 4), formed above the cavity structures 24. In further embodiments, the transistors 36 can be active RF devices, e.g., RF switches, or other active or passive device with, in embodiments, a bias that is different than the substrate bias. The transistors 36 can be formed using multiple gates in an array of alternating source/drain/source/drain/, etc. configuration, as is known in the art. In addition, multiple stacks of multi-finger transistors can be placed, as known in the art. The transistors 36 can also have body contacts formed inside the ring of deep trench isolation 34, formed using any standard device layout as known in the art.

Figure 4:
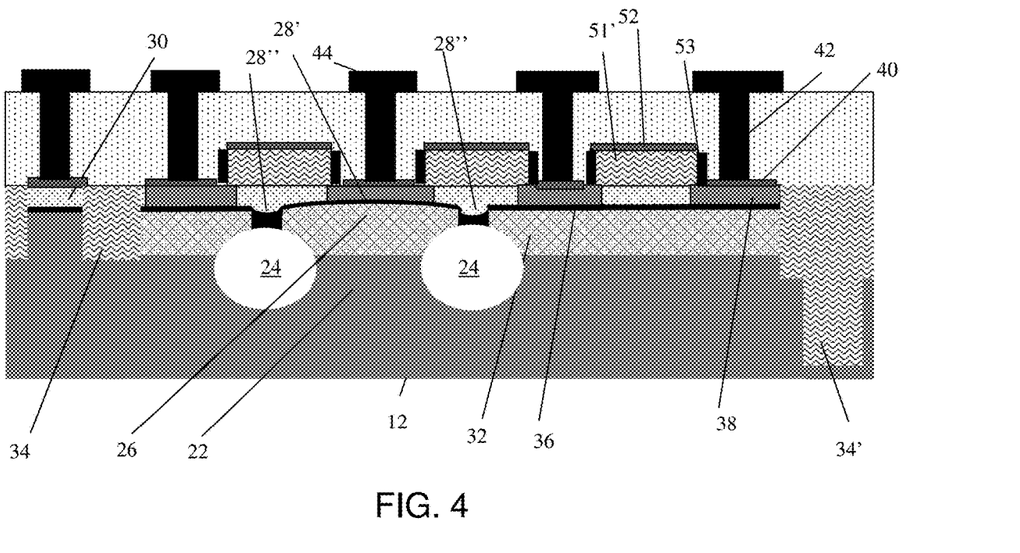
FIG. 4 shows a cross-sectional view of a FET with particular surface topographies, amongst other features, and respective fabrication processes in accordance with additional or alternative aspects of the present disclosure.

FIG. 4 shows a cross-sectional view of a FET with particular surface topographies, amongst other features. More specifically, in this implementation, the epitaxial material 28 will have a bowed down surface topography 28" above the cavity structures 24, under an NFET gate 51'. This topography will effectively create a bowed up surface topography 28' under the source/drain regions 38. By having the different surface topographies, e.g., bowed down surface topographies and bowed up surface topographies, a tensile stress is created in the channel region which effectively increases the performance of the NFET gate 51', e.g., by applying a tensile stress on the NFET using bow down topography 28" in the channel region to improve NFET electron mobility. The remaining features are as described with respect to FIG. 3.

Figure 5A:
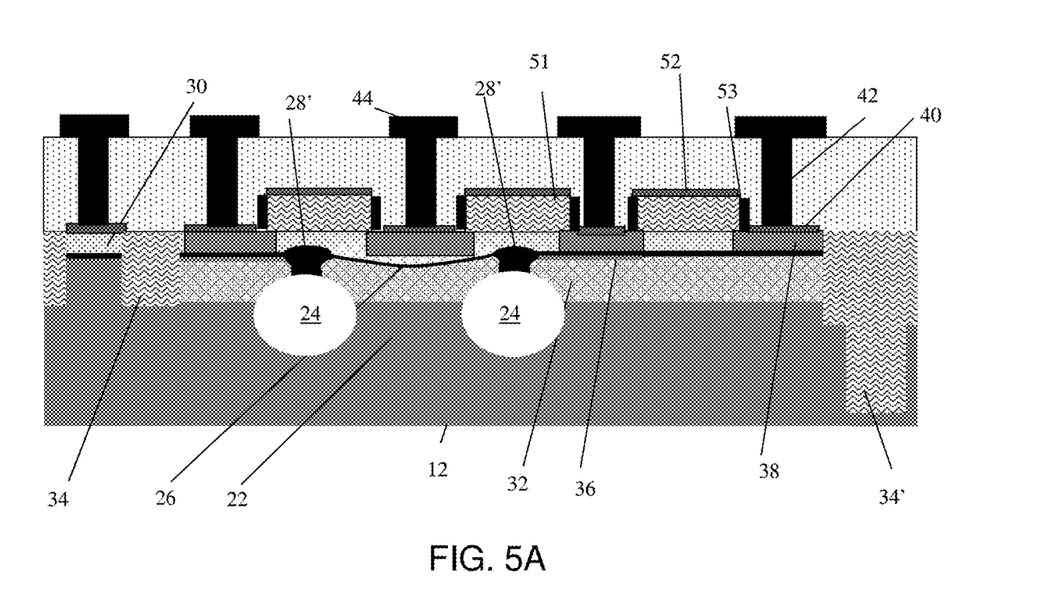
FIGS. 5A and 5B show cross-sectional views of FETs with particular surface topographies, amongst other features, and respective fabrication processes in accordance with additional or alternative aspects of the present disclosure.

FIG. 5A shows a cross-sectional view of a PFET with particular surface topographies, amongst other features. More specifically, in this implementation, the epitaxial material 28 will have a bowed up surface topography 28' above the cavity structures 24, under an PFET gate 51. By having this surface topography, e.g., bowed up surface topographies, a compressive stress is created in the channel region which effectively increases the performance of the PFET gate 51. The remaining features are as described with respect to FIG. 3.

Figure 5B:
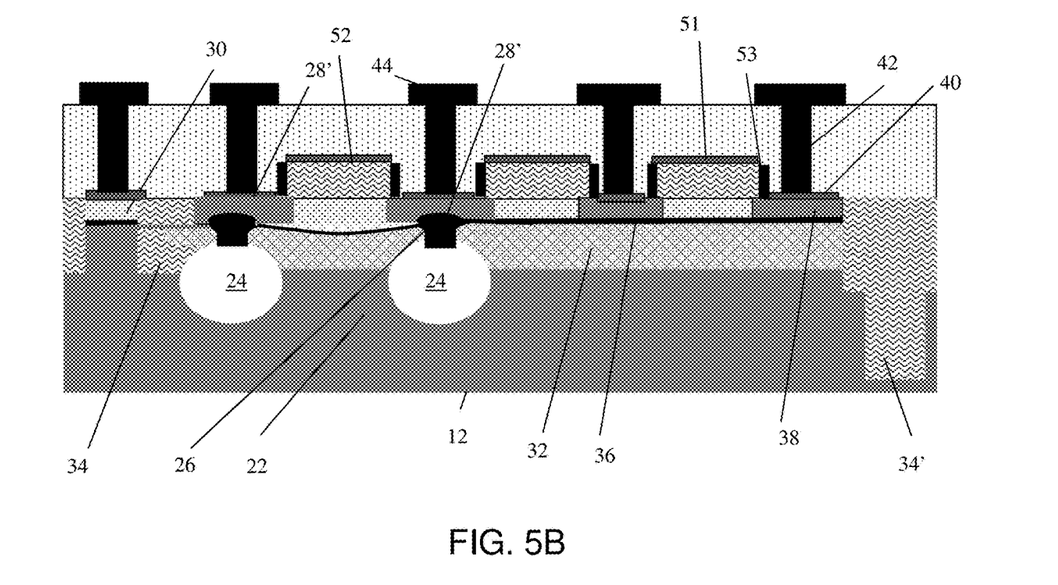

In FIG. 5B, the epitaxial material 28 will have a bowed up surface topography 28' under the source and drain regions 38 for an NFET gate 52. By having this surface topography, e.g., bowed up surface topographies, a tensile stress is created in the channel region of the NFET, which effectively increases the performance of the NFET gate 52. The remaining features are as described with respect to FIG. 3.

Figure 6A:
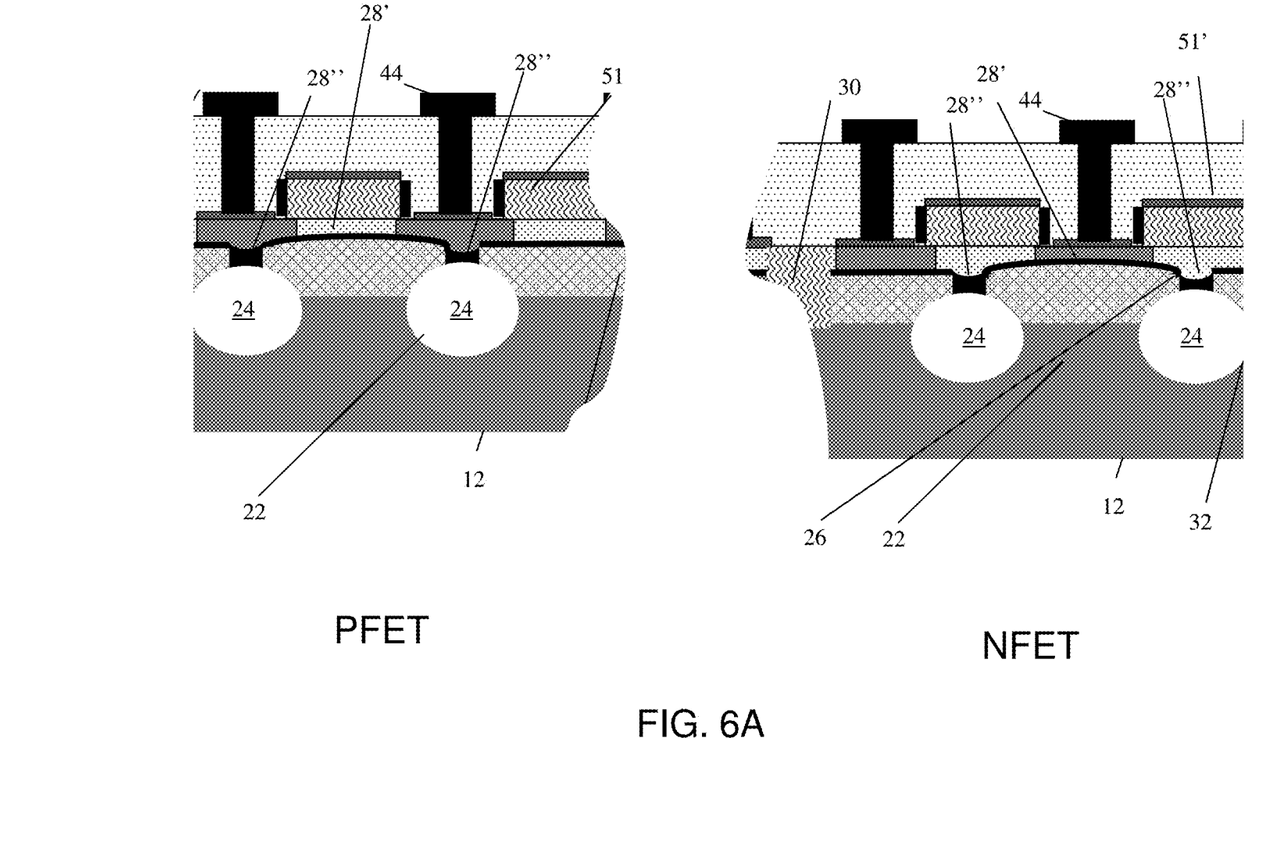
FIGS. 6A and 6B show cross-sectional views of FETs with different surface topographies, e.g., bowed down surface topographies and bowed up surface topographies, amongst other features, and respective fabrication processes in accordance with aspects of the present disclosure.

FIG. 6A shows a cross-sectional view of a FET with different surface topographies, e.g., bowed down surface topographies 28" and bowed up surface topographies 28', amongst other features. More specifically, in this implementation, the bowed down surface topographies 28" are provided under the NFET gate 51'; whereas, the bowed up surface topographies 28' are under the PFET gate 51. Accordingly, a single wafer can include both the bowed down surface topographies 28" and bowed up surface topographies 28' to provide a compressive stress for a PFET and a tensile stress for an NFET, hence increasing performance for both the PFET and the NFET on a same wafer.

It should also be understood that any combination of the bowed down surface topographies 28" and bowed up surface topographies 28' can be provided on a single wafer, in any combination of under the source/drain regions and/or the gates to provide a localized stress component, depending on the type of FET and the designed performance parameters of the particular FET. Accordingly, as representatively shown in FIG. 6A, a layout can include NFETs laterally alternating with PFETs separated by a shallow trench isolation 35, which uses the epi seal undulation (e.g., surface topographies 28', 28") to optimize the stress on NFET and PFET simultaneously. In addition, the layout can include the NFET across from the PFET separated by shallow trench isolation 35 which uses the seal topography to independently optimize the stress on both the NFET and PFET.

Figure 6B:
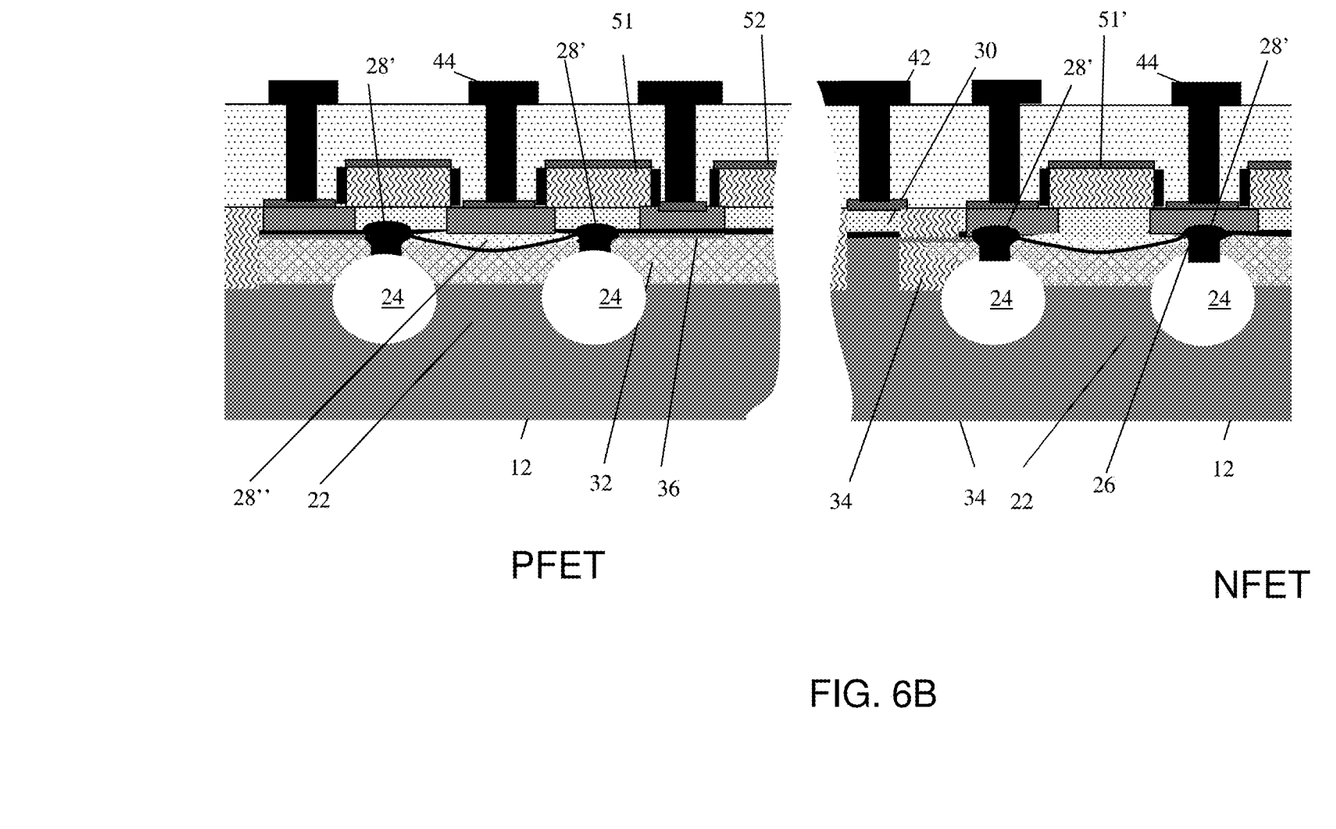

In FIG. 6B, for the PFET side of the device, the cavity 24 and bowed up surface topographies 28' are provided under the PFET gate 51'; whereas, for the NFET side of the device, the cavity 24 and bowed up surface topographies 28' are provided under the source and drain regions of the NFET gate 51'. This configuration will provide compressive stress for the PFET and tensile stress for the NFET, hence increasing performance for both the PFET and the NFET on a same wafer. In addition, it should be recognized by those of skill in the art that the surface topographies (e.g., bowed up 28' or bowed down 28") provide a vertical stress component; however, it is also contemplated herein that in any of the embodiments described herein, the epitaxial material can provide a lateral compressive stress component along the length of the device. In embodiments, the lateral stress component is beneficial for PFET devices.

Figure 8:
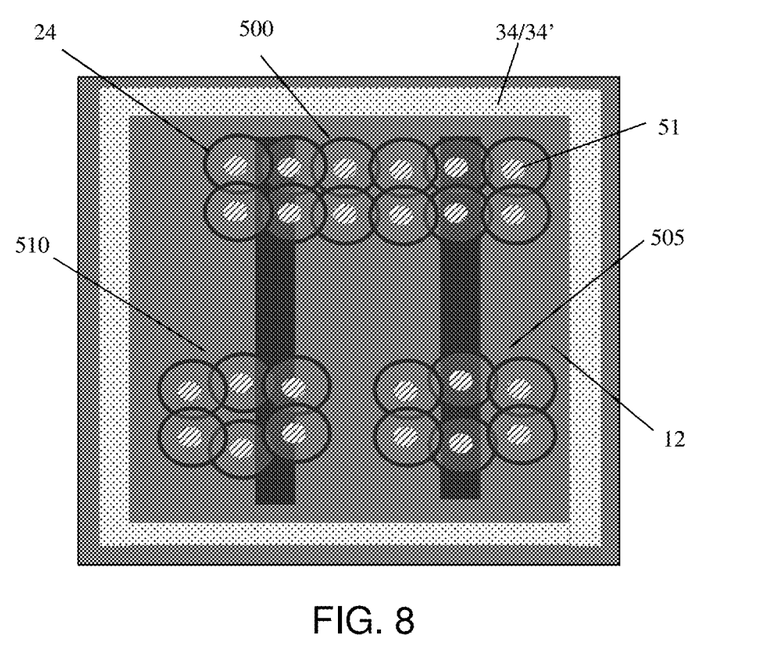
FIG. 8 shows a top view of an embodiment with cavities under both the FET source/drain and gate in accordance with aspects of the present disclosure.

FIG. 7 shows a top view of a FET with cavity structures 105 under the source or drain regions 100 and cavity structures 105' under the gate structure 200. The cavity structures 105 may be isolated, i.e., not touch each other, or the cavity structures 105 can be connected as shown in FIG. 8 (and FIGS. 9A-9D), where they are connected in the direction parallel to the FET gate and source/drain region. If the cavity structures 105 are connected, then they form a continuous cylindrical cavity under the FET source/drain, gate, or both. In any of these different scenarios, the source/drain regions and/or gates can be provided with different surface topographies as already described herein in order to increase device performance.

Figure 10A:
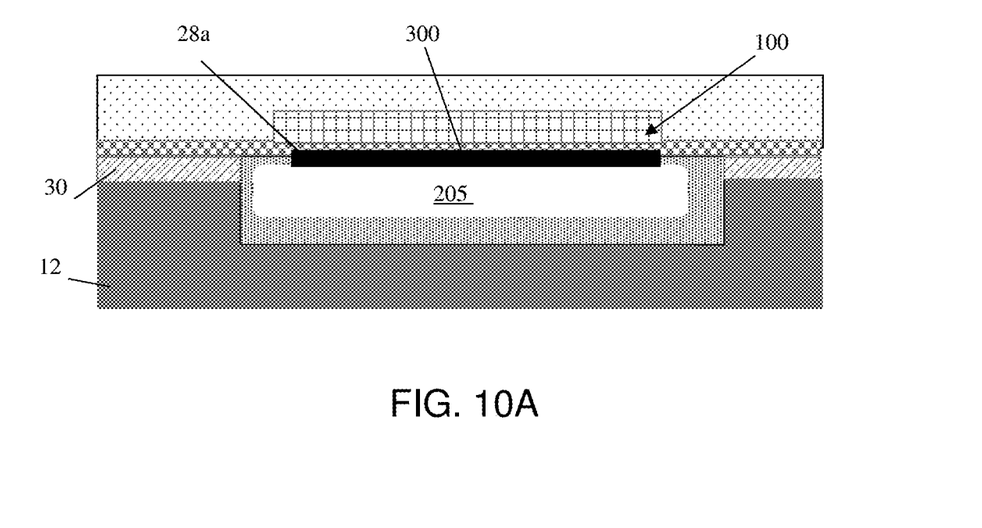
FIGS. 10A and 10B show cross-sectional views of a sealed bar (trench with sealing material along its entirety) extending under the source/drain and/or gate regions as shown in FIG. 7, in accordance with aspects of the present disclosure.
Figure 10B:
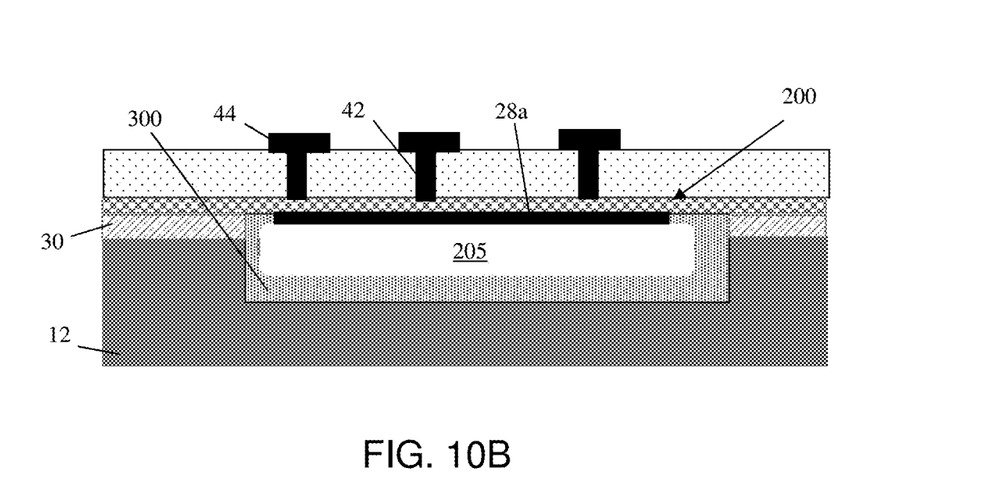

The structure shown in FIG. 7 also shows a cavity structure 205 sealed with epitaxial material 28a over a single bar or trench 205a (as further shown in FIGS. 10A and 10B). In this implementation, the bar or trench 205a is initially formed in a semiconductor material using conventional lithography and etching processes as already described herein. The cavity structures 205 are then formed by an additional etching processes as already described herein (with the exception that the etching of the cavity is formed through only a single opening (e.g., single bar or trench 205a), compared to several openings (holes) already described. In this way, the single cavity 205 will now be formed under the single bar or trench 205a. As should be realized by those of skill in the art, the cavity 205 will have a different dimension than the bar or trench 205a (e.g., larger cross-sectional area).

The single opening of the bar or trench 205a is then sealed with the epitaxial material 28a. In embodiments, as in any of the embodiments, the cavity structure 205 can extend under the FET source/drain, gate, or both (as seen in FIGS. 10A and 10B). In any of these different scenarios, the source/drain regions and/or gates can be provided with different surface topographies of the epitaxial material 28a as already described herein in order to increase device performance.

FIG. 8 shows a top view of an embodiment with the cavity structures 110 under both the FET source/drain and gate. In embodiment represented by reference numeral 500, the cavities are connected in the X and Y directions with a region of silicon to the left and right of each gate remaining. In embodiments represented by reference numerals 505, 510, the cavity pitch under the gate is greater (as shown by reference numeral 505) than the cavity pitch under the source/drain and there is a region of silicon that remains both under the gate and under the source/drain (as shown by reference numeral 505). In embodiments, the cavity pitch under the gate is lesser (as shown by reference numeral 510) than the cavity pitch under the source/drain and there is a region of silicon that remains both under the gate and under the source/drain as shown by reference numeral 510. For these embodiments shown in FIG. 8, a larger area of silicon under the FET is removed. In embodiments not shown, the cavity connects both in the X and Y direction and extends to the deep trench isolation 34 (not shown) or 34' (shown).

Figure 9A:
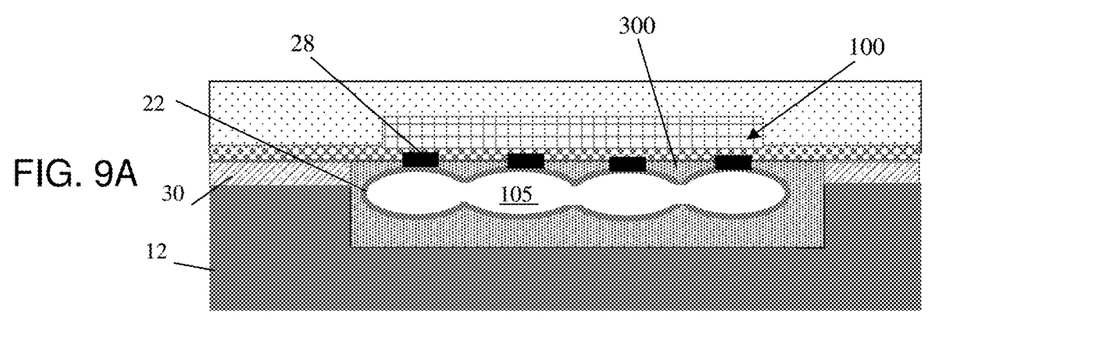
FIG. 9A shows a cross-sectional view of a vertical cut through the source/drain cavity shown in FIG. 8.
Figure 9B:
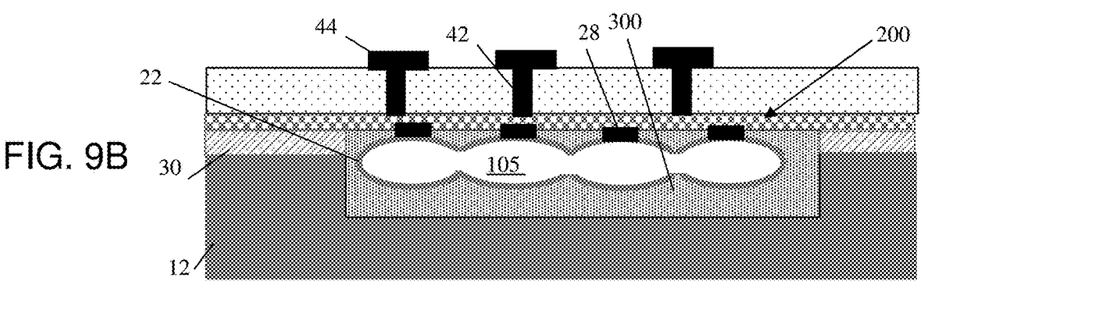
FIG. 9B shows a cross-sectional view of a vertical cut through the gate cavity shown in FIG. 8.
Figure 9C:
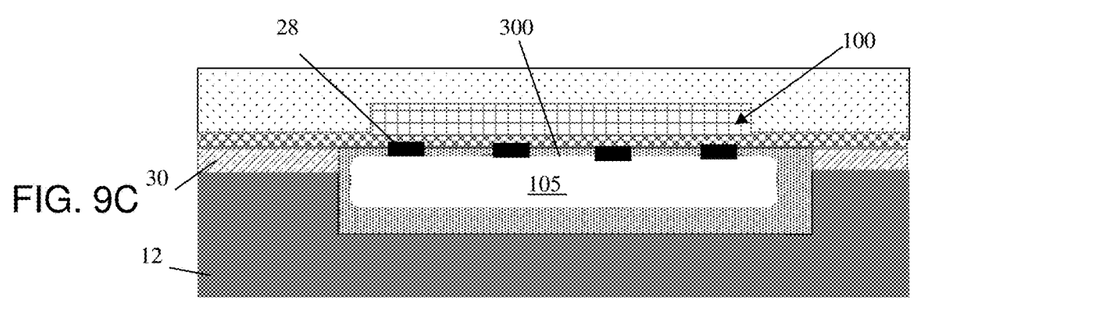
FIG. 9C shows a cross-sectional view of a vertical cut through the source/drain cavity shown in FIG. 8.
Figure 9D:
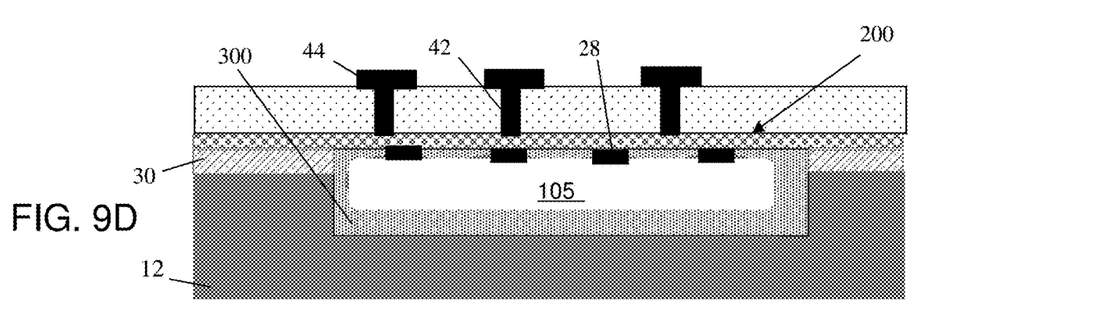
FIG. 9D shows a cross-sectional view of a vertical cut through the gate cavity shown in FIG. 8.

FIG. 9A shows a cross-sectional view of a vertical cut through of the cavity structure 105 through the gate 200 shown in FIG. 7; and FIG. 9B shows a cross-sectional view of a vertical cut through the cavity structure 105 through the source/drain 100 shown in FIG. 7. In these cases, the cavity layout and etch diameter caused the cavities 105 to connect parallel to the source/drain/gate but not connect perpendicular to the source/drain/gate. In embodiments, cavities 105 could be formed to connect (merged) under the source/drain/gate of the FET (not shown). The connected cavity structures 105 shown in FIGS. 9A and 9B are shown not fully reflowed. In embodiments, the cavity sealing process temperature or epi silicon deposition temperature could be high enough to cause the cavities to reflow in a planar fashion, as shown in FIGS. 9C and 9D, which are analogous to FIGS. 4A and 4B but with increased cavity reflow resulting in smooth cavity walls.

FIGS. 10A and 10B show cross-sectional views of a bar (trench) extending under the gate and source/drain regions. In particular, FIG. 10A shows a cross-sectional view of a cavity structure 205 under the bar or trench 205a under gate 200 (as shown in FIG. 7); whereas, FIG. 10B shows a cross-sectional view of a cavity structure 205 under the bar or trench 205a under the source/drain 100. In embodiments, the cavity structure 205 can formed under the bar 205a by extending the width and depth of the bar into the underlying semiconductor material using conventional lithography and etching processes.

In the implementations of FIGS. 10A and 10B, the epitaxial material 28a will seal the bar or trench 205a along its entire length as the bar 205a is only a single opening formed on top of the cavity 205. That is, a single seal will be used in the embodiments shown in FIGS. 10A and 10B (as compared to a plurality of SiGe seals along the gate or source and drain regions in individual holes). In embodiments, the epitaxial material 28a can be SiGe material reflowed in the processes as already described herein. It is noted that by having a single seal of epitaxial material 28a over the bar or trench 205a, it is possible to achieve a maximum stress effect (compressive for PFETs and tensile for NFETs) for the SiGe sealing with bow up or bow down topographies all through under the gate and/or source and drain regions. Additionally, a reduction of junction capacitance can be potentially maximized by merged cavities or by a bar but the stress is preferably maximized by the bar 205a, i.e., by extending the SiGe topography and thus the stress.

Accordingly, as should now be understood by those of skill in the art and as shown in the figures or combinations of these figures (as each of the final structures shown herein can be combined to form one or more chips), the cavity can be: (i) only under a source region and a drain region of a gate structure; (ii) under a source region and extends under a gate structure on the planar surface; (iii) only under a gate structure; (iv) under gate structure and extends partially under source/drain regions of the gate structure. In addition, a depletion region under source/drain regions of the gate structure can be intersected by the cavity. The triple well under the gate structure can also be intersected by the cavity.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a cavity formed in a substrate material, the cavity being covered with epitaxial material that has a non-planar surface topography, wherein the epitaxial material that has the non-planar surface topography imparts a stress component on a transistor.

2. The structure of claim 1, wherein the cavity comprises a trench which includes a curvature at its open end.

3. The structure of claim 1, wherein the epitaxial material is a reflowed SiGe material and upper Si sealing layer.

4. The structure of claim 3, wherein the transistor is formed on the upper Si sealing layer which imparts the stress component created from the reflowed SiGe material, above the cavity.

5. The structure of claim 1, wherein the non-planar surface topography is tailored to apply a tensile stress on NFETs in a channel region to improve NFET electron mobility.

6. The structure of claim 1, wherein the non-planar surface topography is tailored to apply a compressive stress on PFETs in a channel region to improve PFET hole mobility.

7. The structure of claim 1, wherein the non-planar surface topography creates a compressive stress on PFETs from a source/drain region to a channel region and a tensile stress on NFETs from a source/drain region to a channel region.

8. The structure of claim 1, wherein the stress component is a vertical stress component.

9. The structure of claim 1, wherein the cavity is located under a channel for NFETs and under source/drain regions for PFETs and the non-planar surface topography is bow down the surface topography.

10. The structure of claim 1, wherein the cavity is located under a channel for PFETs and under source/drain regions for NFETs and the non-planar surface topography is bow up the surface topography.

11. The structure of claim 1, further comprising an NFET laterally alternating with a PFET separated by an isolation region and the non-planar surface topography is an epi seal undulation to optimize the stress component on the NFET and the PFET simultaneously.

12. The structure of claim 1, further comprising an NFET across from a PFET and separated by an isolation region and the non-planar surface topography to independently optimize the stress component on the NFET and the PFET.

13. The structure of claim 1, wherein the cavity is a trench with a single opening sealed with the epitaxial material to maximize a stress component.

14. A structure comprising:
    a substrate material;
    a cavity formed in the substrate which includes a trench having a curved edge portion at its upper end;
    a first material within the trench which migrates to the upper end of the trench and which includes a non-planar surface topography; and
    a second material which covers the first material, the non-planar surface topography of the first material imparting a stress component into the second material.

15. The structure of claim 14, wherein the first material is SiGe, the second material is Si material, the SiGe has a Ge concentration of about 5-30%, and after reflow, the SiGe has a top surface either bowed up or bowed down.

16. The structure of claim 14, further comprising a transistor formed over the non-planar surface topography.

17. The structure of claim 14, wherein the non-planar surface topography is tailored to apply a tensile stress on NFETs in a channel region to improve NFET electron mobility.

18. The structure of claim 14, wherein the non-planar surface topography is tailored to apply a compressive stress on PFETs in a channel region to improve PFET hole mobility.

19. The structure of claim 14, wherein an NFET and a PFET are provided on a wafer separated by an isolation region and the non-planar surface topography optimizes the stress component on both the NFET and the PFET.

* * * * *